(12) United States Patent
Sommers

(10) Patent No.: US 12,372,576 B2
(45) Date of Patent: Jul. 29, 2025

(54) METHODS, SYSTEMS, AND COMPUTER READABLE MEDIA FOR USING A TESTBED TRANSPILER

(71) Applicant: Keysight Technologies, Inc., Santa Rosa, CA (US)

(72) Inventor: Christian Paul Sommers, Bangor, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 337 days.

(21) Appl. No.: 17/896,062

(22) Filed: Aug. 25, 2022

(65) Prior Publication Data
US 2024/0069099 A1 Feb. 29, 2024

(51) Int. Cl.
- *H04L 43/50* (2022.01)
- *G01R 31/3183* (2006.01)
- *G01R 31/319* (2006.01)

(52) U.S. Cl.
CPC ............ *G01R 31/31908* (2013.01); *G01R 31/318314* (2013.01); *G01R 31/31905* (2013.01)

(58) Field of Classification Search
CPC ...... G01R 31/318314; G01R 31/31905; G01R 31/31908; G06F 11/3664; H04L 41/0806; H04L 41/344; H04L 41/40; H04L 43/50
See application file for complete search history.

(56) References Cited

U.S. PATENT DOCUMENTS

| | | |
|---|---|---|
| 4,792,753 A | 12/1988 | Iwai |
| 5,247,517 A | 9/1993 | Ross et al. |
| (Continued) | | |

FOREIGN PATENT DOCUMENTS

| | | | | |
|---|---|---|---|---|
| EP | 0895375 A2 | 2/1999 | | |
| EP | 3121729 A1 * | 1/2017 | .......... | G01M 17/007 |
| (Continued) | | | | |

OTHER PUBLICATIONS

Notice of Allowance and Fee(s) Due for U.S. Appl. No. 17/162,620 (Jul. 13, 2022).

(Continued)

*Primary Examiner* — Phuc H Tran

(57) ABSTRACT

One example method occurs at a testbed transpiler of a network test system. The method comprises: receiving test configuration information associated with a test session for configuring a test infrastructure, wherein the test infrastructure includes a switching fabric emulator comprising at least one switching application-specific integrated circuit (ASIC) or programmable switching chip, wherein the test configuration information includes information for configuring the switching fabric emulator to emulate one or more emulated switches; generating, using input regarding an updated test infrastructure and the test configuration information, updated test configuration information for configuring the updated test infrastructure, wherein generating the updated test configuration information includes transpiling or translating a portion of the test configuration information to generate configuration instructions for configuring a physical or non-emulated testbed element; and providing the updated test configuration information to the updated test infrastructure or a related test configuration manager.

20 Claims, 5 Drawing Sheets

(56) References Cited

U.S. PATENT DOCUMENTS

| | | |
|---|---|---|
| 5,343,463 A | 8/1994 | Van Tetering et al. |
| 5,390,314 A | 2/1995 | Swanson |
| 5,477,531 A | 12/1995 | McKee et al. |
| 5,535,338 A | 7/1996 | Krause et al. |
| 5,568,471 A | 10/1996 | Hershey et al. |
| 5,583,792 A | 12/1996 | Li et al. |
| 5,590,285 A | 12/1996 | Krause et al. |
| 5,600,632 A | 2/1997 | Schulman |
| 5,657,438 A | 8/1997 | Wygodny et al. |
| 5,671,351 A | 9/1997 | Wild et al. |
| 5,751,963 A | 5/1998 | Umetsu |
| 5,761,486 A | 6/1998 | Watanabe et al. |
| 5,787,147 A | 7/1998 | Gundersen |
| 5,787,253 A | 7/1998 | McCreery et al. |
| 5,822,520 A | 10/1998 | Parker |
| 5,838,919 A | 11/1998 | Schwaller et al. |
| 5,850,386 A | 12/1998 | Anderson et al. |
| 5,850,388 A | 12/1998 | Anderson et al. |
| 5,854,889 A | 12/1998 | Liese et al. |
| 5,878,032 A | 3/1999 | Mirek et al. |
| 5,905,713 A | 5/1999 | Anderson et al. |
| 5,974,237 A | 10/1999 | Shurmer et al. |
| 5,974,457 A | 10/1999 | Waclawsky et al. |
| 5,978,940 A | 11/1999 | Newman et al. |
| 5,982,852 A | 11/1999 | Schwartz |
| 6,031,528 A | 2/2000 | Langfahl, Jr. |
| 6,044,091 A | 3/2000 | Kim |
| 6,108,800 A | 8/2000 | Asawa |
| 6,122,670 A | 9/2000 | Bennett et al. |
| 6,148,277 A | 11/2000 | Asava et al. |
| 6,172,989 B1 | 1/2001 | Yanagihara et al. |
| 6,173,333 B1 | 1/2001 | Jolitz et al. |
| 6,189,031 B1 | 2/2001 | Badger et al. |
| 6,233,256 B1 | 5/2001 | Dieterich et al. |
| 6,279,124 B1 | 8/2001 | Brouwer et al. |
| 6,295,557 B1 | 9/2001 | Foss et al. |
| 6,317,788 B1 | 11/2001 | Richardson |
| 6,321,264 B1 | 11/2001 | Fletcher et al. |
| 6,345,302 B1 | 2/2002 | Bennett et al. |
| 6,363,056 B1 | 3/2002 | Beigi et al. |
| 6,430,617 B1 | 8/2002 | Britt et al. |
| 6,446,121 B1 | 9/2002 | Shah et al. |
| 6,507,923 B1 | 1/2003 | Wall et al. |
| 6,526,259 B1 | 2/2003 | Ho |
| 6,545,979 B1 | 4/2003 | Poulin |
| 6,601,020 B1 | 7/2003 | Myers |
| 6,621,805 B1 | 9/2003 | Kondylis et al. |
| 6,678,246 B1 | 1/2004 | Smyth |
| 6,717,917 B1 | 4/2004 | Weissberger et al. |
| 6,826,259 B2 | 11/2004 | Hoffman |
| 6,845,352 B1 | 1/2005 | Wang |
| 7,099,438 B2 | 8/2006 | Rancu et al. |
| 7,123,616 B2 | 10/2006 | Weissberger et al. |
| 7,143,159 B1 | 11/2006 | Grace et al. |
| 7,327,686 B2 | 2/2008 | Standridge |
| 7,342,897 B1 | 3/2008 | Nader et al. |
| 7,366,174 B2 | 4/2008 | MacFaden et al. |
| 7,418,492 B1 | 8/2008 | Cohen et al. |
| 7,486,728 B2 | 2/2009 | Park |
| 7,507,948 B2 | 3/2009 | Park et al. |
| 7,525,473 B2 | 4/2009 | Chu et al. |
| 7,840,664 B2 | 11/2010 | Dugatkin et al. |
| 7,873,056 B2 | 1/2011 | Higuchi et al. |
| 8,718,070 B2 | 5/2014 | Koponen et al. |
| 8,761,187 B2 | 6/2014 | Barde |
| 8,898,333 B1 | 11/2014 | White et al. |
| 8,914,432 B2 | 12/2014 | Hannel et al. |
| 8,949,830 B2 | 2/2015 | Kannan et al. |
| 8,959,185 B2 | 2/2015 | Nakil et al. |
| 9,049,271 B1 | 6/2015 | Hobbs et al. |
| 9,231,849 B2 | 1/2016 | Hyoudou et al. |
| 9,294,296 B2 | 3/2016 | Kirschnick et al. |
| 9,628,339 B1 | 4/2017 | Thai et al. |
| 9,697,172 B1 | 7/2017 | Somohano et al. |
| 9,819,551 B2 | 11/2017 | Forster et al. |
| 9,898,317 B2 | 2/2018 | Nakil et al. |
| 10,015,072 B2 | 7/2018 | Cantwell et al. |
| 10,063,473 B2 | 8/2018 | Wenig |
| 10,579,408 B2 | 3/2020 | Wang et al. |
| 10,686,671 B1 | 6/2020 | Mozumdar et al. |
| 10,733,088 B1 | 8/2020 | Sommers |
| 10,742,533 B2 | 8/2020 | Yadav et al. |
| 10,868,730 B2 | 12/2020 | Mozumdar et al. |
| 10,880,197 B2 | 12/2020 | Naskar et al. |
| 11,144,691 B2 * | 10/2021 | Ghattas ............... G06F 30/331 |
| 11,323,326 B2 | 5/2022 | Kommula et al. |
| 11,323,354 B1 | 5/2022 | Sommers |
| 11,405,302 B1 | 8/2022 | Liu et al. |
| 11,483,228 B2 | 10/2022 | Liu et al. |
| 2001/0016867 A1 | 8/2001 | Hu et al. |
| 2002/0056100 A1 | 5/2002 | Shimomura et al. |
| 2002/0105911 A1 | 8/2002 | Pruthi et al. |
| 2002/0138226 A1 | 9/2002 | Doane |
| 2002/0162059 A1 | 10/2002 | Mcneely et al. |
| 2002/0172205 A1 | 11/2002 | Tagore-Brage et al. |
| 2002/0184527 A1 | 12/2002 | Chun et al. |
| 2003/0009544 A1 | 1/2003 | Wach |
| 2003/0043434 A1 | 3/2003 | Brachmann et al. |
| 2003/0061506 A1 | 3/2003 | Cooper et al. |
| 2003/0069952 A1 | 4/2003 | Tams et al. |
| 2003/0139919 A1 | 7/2003 | Sher et al. |
| 2003/0188003 A1 | 10/2003 | Sylvest et al. |
| 2003/0191590 A1 | 10/2003 | Narayan et al. |
| 2003/0231741 A1 | 12/2003 | Rancu et al. |
| 2004/0111502 A1 | 6/2004 | Oates |
| 2004/0111519 A1 | 6/2004 | Fu et al. |
| 2004/0236866 A1 | 11/2004 | Dugatkin et al. |
| 2005/0021715 A1 | 1/2005 | Dugatkin et al. |
| 2008/0186968 A1 | 8/2008 | Farinacci et al. |
| 2013/0013107 A1 | 1/2013 | Felique |
| 2014/0006570 A1 | 1/2014 | Loos et al. |
| 2014/0047125 A1 | 2/2014 | Hyoudou et al. |
| 2014/0160961 A1 | 6/2014 | Dragulescu et al. |
| 2014/0321285 A1 | 10/2014 | Chew et al. |
| 2015/0317169 A1 | 11/2015 | Sinha et al. |
| 2015/0365288 A1 | 12/2015 | Van Der et al. |
| 2017/0126588 A1 | 5/2017 | Anand et al. |
| 2017/0155569 A1 * | 6/2017 | Chinnaswamy ...... H04L 41/122 |
| 2017/0353531 A1 | 12/2017 | Conn |
| 2019/0372881 A1 | 12/2019 | Hu et al. |
| 2020/0021512 A1 | 1/2020 | Naskar et al. |
| 2020/0028772 A1 | 1/2020 | Laslau |
| 2020/0112524 A1 | 4/2020 | Sindhu et al. |
| 2020/0133688 A1 | 4/2020 | Shinde et al. |
| 2020/0195519 A1 | 6/2020 | Di Martino |
| 2020/0313999 A1 | 10/2020 | Lee et al. |
| 2021/0226843 A1 * | 7/2021 | Bhaduri ............. H04L 41/0806 |
| 2022/0116303 A1 | 4/2022 | Sommers et al. |
| 2022/0247661 A1 | 8/2022 | Liu et al. |

FOREIGN PATENT DOCUMENTS

| | | |
|---|---|---|
| JP | 4620103 B2 | 1/2011 |
| WO | 02056541 A2 | 7/2003 |

OTHER PUBLICATIONS

Notice of Allowance and Fee(s) Due for U.S. Appl. No. 17/162,620 (Jun. 23, 2022).

Notice of Allowance and Fee(s) Due for U.S. Appl. No. 17/198,870 (Mar. 24, 2022).

Notice of Allowance and Fee(s) Due for U.S. Appl. No. 17/067,627 (Feb. 8, 2022).

Notice of Allowance and Fee(s) Due for U.S. Appl. No. 17/067,627 (Oct. 22, 2021).

Non-Final Office Action for U.S. Appl. No. 17/198,870 (Sep. 17, 2021).

Notice of Allowance and Fee(s) Due for U.S. Appl. No. 17/067,627 (Aug. 20, 2021).

Commonly-Assigned, co-pending U.S. Appl. No. 17/067,627 for "Methods, Systems, and Computer Readable Media for Network Testing Using Switch Emulation," (Unpublished, filed Oct. 9, 2020).

(56) References Cited

OTHER PUBLICATIONS

Zhang et al., "HyperV: A High Performance Hypervisor for Virtualization of the Programmable Data Plane," 2017 26th International Conference on Computer Communication and Networks (ICCCN), pp. 1-9 (2017).
Cziva et al., "High-Performance Virtualized SDN Switches for Experimental Network Testbeds," SI:SC16—INDIS, pp. 1-14 (Nov. 8, 2016).
Khalidi, "SONIC: The networking switch software that powers the Microsoft Global Cloud," Blog(/en-us/blog/) Cloud Strategy, ppp. 1-10 (Mar. 8, 2017).
Siron, "What is the Hyper-V Virtual Switch and How Does it Work?" Altaro, pp. 1-22 (Sep. 26, 2019).
Han et al., "Virtualization in Programmable Data Plane: A Survey and Open Challenges," IEEE Open Journal of the Communications Society, pp. 1-7 (2020).
"Networking/SAI," Open Compute, pp. 1-6 (Oct. 2020).
Zhou et al., "HyperTester: High-performance Network Testing Driven by Programmable Switches," In The 15th International Conference on emerging Networking Experiments and Technologies (CoNEXT '19), pp. 1-14 (Dec. 9-12, 2019).
Byagowi, A., et al., "Bringing the F16 Network into the Lab," OCP Global Summit, pp. 1-16 (Jan. 29, 2021).
Zhang, C., et al., "MPVisor: A Modular Programmable Data Plane Hypervisor," SOSR, pp. 1-2 (Apr. 3-4, 2017).

\* cited by examiner

METHODS, SYSTEMS, AND COMPUTER READABLE MEDIA FOR USING A TESTBED TRANSPILER

TECHNICAL FIELD

The subject matter described herein relates to network testing. More specifically, the subject matter relates to methods, systems, and computer readable media for using a testbed transpiler.

BACKGROUND

Data center environments typically provide high reliability and security and typically include networked resources (e.g., virtual or physical servers connected via network switches) sharable by multiple clients of the data center operator. Large data centers are industrial scale operations using as much electricity as a small town. Various data centers may utilize virtualization. For example, a data center may implement multiple virtual machines (VMs) that communicate via a virtual switch (vSwitch), e.g., virtual servers, using a physical central processing unit (CPU)-based server or node in the data center. In this example, each VM may execute an operating system and other software, where each VM may appear as a physical server to end users.

When testing data center equipment, it is important to make sure that testing mimics real world scenarios and conditions. For example, when testing a data center server or related applications, it may be necessary to mimic or emulate a switching fabric or other resources in the data center and to emulate or approximate various test scenarios or related processing states, e.g., by using test traffic and/or effecting various processing scenarios.

SUMMARY

Methods, systems, and computer readable media for using a testbed transpiler are disclosed. One example method occurs at a testbed transpiler of a network test system implemented using at least one processor, the method comprising: receiving test configuration information associated with a test session for configuring a test infrastructure connecting at least one test application and a system under test (SUT), wherein the test infrastructure includes a switching fabric emulator comprising at least one switching application-specific integrated circuit (ASIC) or programmable switching chip, wherein the test configuration information includes information for configuring the switching fabric emulator to emulate one or more emulated switches by allocating resources of the at least one switching ASIC or programmable switching chip to the one or more emulated switches; generating, using input regarding an updated test infrastructure and the test configuration information, updated test configuration information for configuring the updated test infrastructure, wherein the updated test infrastructure includes a physical or non-emulated testbed element, wherein generating the updated test configuration information includes transpiling or translating a portion of the test configuration information to generate configuration instructions for configuring the physical or non-emulated testbed element; and providing the updated test configuration information to the updated test infrastructure or a related test configuration manager.

According to one example system, the system includes a testbed transpiler of a network test system implemented using at least one processor and a memory, the testbed transpiler configured for: receiving test configuration information associated with a test session for configuring a test infrastructure connecting at least one test application and a SUT, wherein the test infrastructure includes a switching fabric emulator comprising at least one switching ASIC or programmable switching chip, wherein the test configuration information includes information for configuring the switching fabric emulator to emulate one or more emulated switches by allocating resources of the at least one switching ASIC or programmable switching chip to the one or more emulated switches; generating, using input regarding an updated test infrastructure and the test configuration information, updated test configuration information for configuring the updated test infrastructure, wherein the updated test infrastructure includes a physical or non-emulated testbed element, wherein generating the updated test configuration information includes transpiling or translating a portion of the test configuration information to generate configuration instructions for configuring the physical or non-emulated testbed element; and providing the updated test configuration information to the updated test infrastructure or a related test configuration manager.

The subject matter described herein may be implemented in software in combination with hardware and/or firmware. For example, the subject matter described herein may be implemented in software executed by a processor. In one example implementation, the subject matter described herein may be implemented using a non-transitory computer readable medium having stored therein computer executable instructions that when executed by the processor of a computer control the computer to perform steps. Example computer readable media suitable for implementing the subject matter described herein include non-transitory devices, such as disk memory devices, chip memory devices, programmable logic devices, field-programmable gate arrays, and application specific integrated circuits. In addition, a computer readable medium that implements the subject matter described herein may be located on a single device or computer platform or may be distributed across multiple devices or computer platforms.

As used herein, the term 'node' refers to a physical computer platform including one or more processors, network interfaces, and memory.

As used herein, each of the terms 'function', 'engine', and 'module' refers to hardware (e.g., processor(s), integrated circuit(s), chip(s), etc.), which may also include software and/or firmware, for implementing the feature(s) being described.

BRIEF DESCRIPTION OF THE DRAWINGS

The subject matter described herein will now be explained with reference to the accompanying drawings of which.

DETAILED DESCRIPTION

Figure 1:
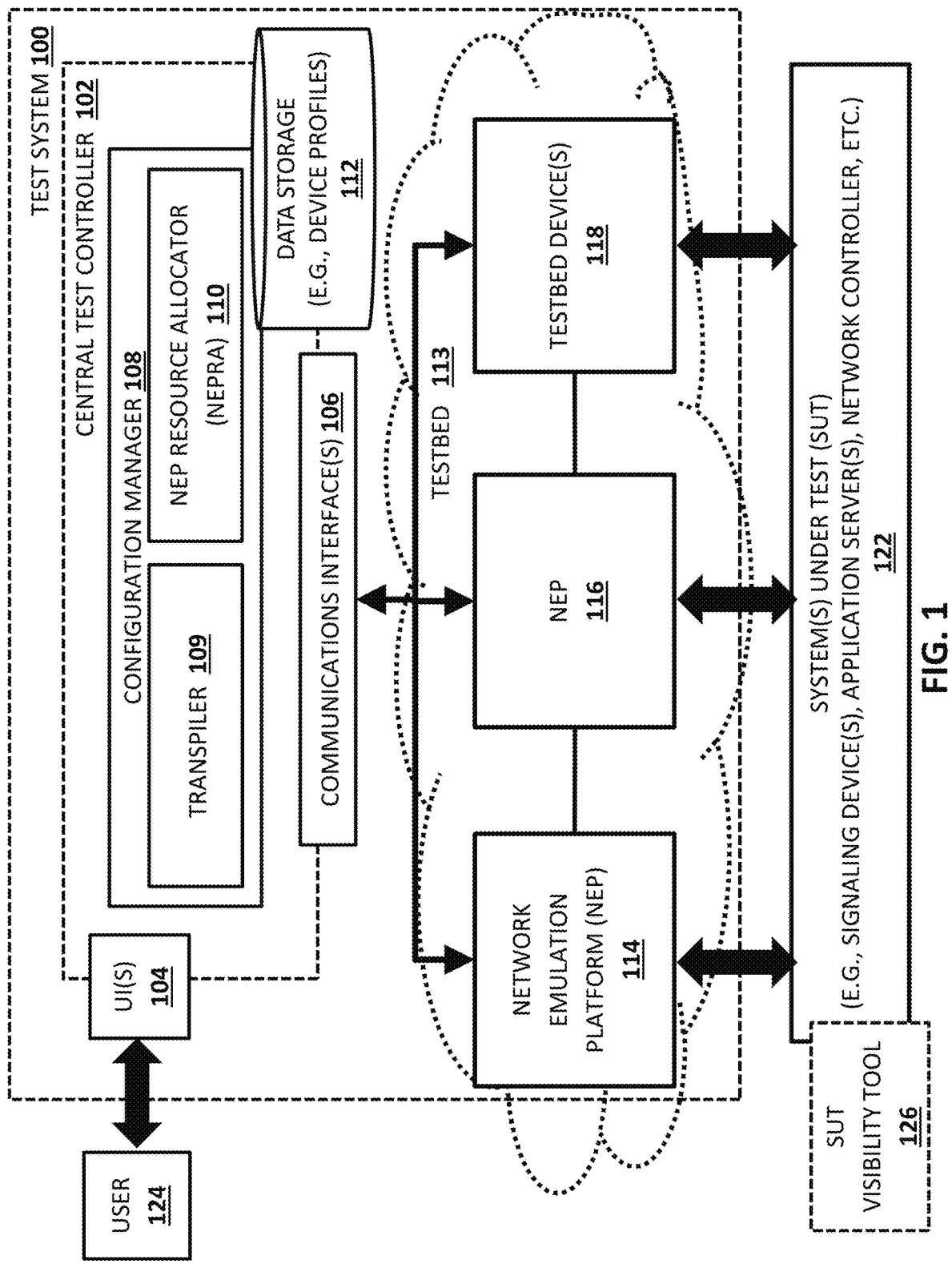
FIG. 1 is a diagram illustrating an example test system for network testing.

The subject matter described herein includes methods, systems, and computer readable media for using a testbed transpiler. Various test environments may be configured for emulating or approximating realistic network scenarios and/or processing scenarios. For example, when testing equipment for use in large-scale networks or data centers, test environments may need to emulate a switching fabric that include includes multiple switches (e.g., network switches, network routers, or other packet forwarding devices). Switching fabric emulation can be useful for testing how a new network product or service performs at scale in a particular environment (e.g., a data center environment) and/or for testing how a new network product or service will impact the performance of a particular switching fabric environment. However, to thoroughly test networks or equipment, a test system may need to perform testing using various configurations of a testbed (e.g., a network or infrastructure connecting a test application to a system under test). For example, a test system may need to interact with and configure network emulation platforms or devices used for emulating switches or other elements of a testbed as well as other types of testbed devices (e.g., physical switches, programmable switches, smartswitches, etc.) that are separate or distinct from network emulation platforms or devices.

In accordance with some aspects of the subject matter described herein, an emulated switch is distinctly different from an entity referred to commonly in the industry as a virtual switch. More particularly, a virtual switch (vSwitch) is a software application that runs on top of a CPU, which allows communication between virtual machines, where the virtual machines are administered by a virtual machine hypervisor. A vSwitch does not subdivide and allocate resources of an underlying physical switch (e.g., an application-specific integrated circuit (ASIC) chip, a P4 programmable chip, or a Tofino chip) into multiple emulated switches, but instead creates a software representation of a completely virtual switch and there is no mapping to underlying physical switching ASIC or chip hardware resources.

In accordance with some aspects of the subject matter described herein, a test system (e.g., one or more computing platforms, devices, or nodes) may be configured to emulate a switching fabric environment (e.g., a data center environment), such as virtual networking resources and/or other switching fabric related resources. In accordance with some aspects of the subject matter described herein, a switching fabric emulator may be implemented using one or more network emulation platforms (NEPs) (e.g., chassis or nodes with one or more physical switching application-specific integrated circuit (ASIC) resources usable for emulating a number of switches connected via various topologies). It will be appreciated that some embodiments include one or more emulated switches, where an emulated switch is a logically allocated portion of a physical switching ASIC of a NEP that appears as an independent logical switch device to the environment (e.g., a device under test (DUT), a system under test (SUT), or controller) by using a NEP resource allocator (NEPRA) and/or a switching ASIC resource allocator (SARA). In some embodiments, the NEPRA and/or SARA may be configured to facilitate collection and reporting of emulated logical switch performance metric information (e.g., emulated logical switch packet queue depth, emulated logical switch latency, etc.) during a test run or session by a visibility module.

In accordance with some aspects of the subject matter described herein, a test system may be configured to configure and/or set up a testbed including emulated elements (e.g., emulated switches implemented using an emulation device) and/or non-emulated elements (e.g., real or physical switches). For example, a test system may include a testbed transpiler or related functionality for transpiling (e.g., generating, translating, converting) existing configuration information (e.g., for configuring an emulated switching fabric) into additional or different configuration information (e.g., for configuring one or more physical or non-emulated testbed devices) and vice versa.

In accordance with some aspects of the subject matter described herein, a test system may be configured to utilize a user interface for facilitating testbed configuration and/or modification. For example, a test system with a testbed transpiler may include a graphical user interface (GUI) and/or application programming interface (API) to allow a test operator or user to select testbed elements to add, remove, or change (e.g., from emulated to non-emulated or vice versa) and may also allow a user to indicate how or whether the test system can automatically configure a testbed or portions thereof, e.g., select physical testbed devices (e.g., from a testbed device profiles store or library) for use. In this example, the testbed transpiler may use user input (e.g., user preferences, testbed device selections, etc.), test feedback information (e.g., from prior test sessions involving an existing testbed configuration), test device profile information (e.g., from a device profile store or library), existing configuration information (e.g., associated with a current or active testbed), and/or other information to generate this additional or different configuration information. In some embodiments, configuration information for configuring one or more physical or non-emulated testbed devices may include testbed device bill of materials (BOM) information, testbed topology information, testbed device configuration parameter settings, configuration files, configuration scripts, connection diagrams, inter-device cabling information, setup instructions, command and control instructions, etc.

In accordance with some aspects of the subject matter described herein, a test system may be configured to analyze and/or compare the test results after executing one or more test sessions using various testbeds, e.g., an emulated switching environment, a partially emulated switching environment, and a physical (e.g., non-emulated) switching environment. For example, a test system with a transpiler module may run a series of performance tests with test traffic traversing an emulated switching fabric comprising emulated switches connected to a SUT and then may run the same series of performance test with test traffic traversing a physical testbed comprising a series of whitebox switches (e.g., configured with transpiler-generated configuration information based on the emulated switching fabric) connected to a SUT. In this example, the test system or related test analyzer may compare the test results associated with the different testbeds and generate reports, graphics, etc. to show similarities, differences, or other notable information.

By utilizing a testbed transpiler to generate configuration information (e.g., configuration, command, and/or control instructions) for configuring and/or setting up emulated and/or non-emulated testbed elements, a test system can configure testbeds (e.g., test environments) and perform testing in an emulated switching environment, a partially emulated switching environment, and a physical switching environment. Further, such a test system can analyze and/or compare results of these different test environments, e.g., total emulated switching fabric vs. partially emulated switching fabric vs. totally physical/real switching fabric. Hence, a test system with a testbed transpiler in accordance with various aspects in the present disclosure may effectively test a SUT using a variety of testbed configurations with little to no in-depth technical input from a test operator, e.g., by transpiling appropriate configuration information for a new or updated testbed from existing or active test configuration information.

It will be appreciated that some aspects of the subject matter described herein may be utilized for various test environments including embodiments that involve emulated switching fabric elements (e.g., data center switches), as well as embodiments that utilize real/physical switching fabric elements. It will be appreciated that other embodiments not shown herein may include test scenarios that involve a combination of both emulated and real or physical data center architectures.

Reference will now be made in detail to exemplary embodiments of the subject matter described herein, examples of which are illustrated in the accompanying drawings. Wherever possible, the same reference numbers will be used throughout the drawings to refer to the same or like parts.

FIG. 1 is a diagram illustrating an example test system 100 for network testing. Test system 100 may represent any suitable entity or entities (e.g., one or more computing platforms, nodes, or devices) associated with testing SUT 122 (e.g., one or more application servers, command and/or signaling devices, a network controller, or a network management system). For example, test system 100 may include a central test controller (CTC) 102 for allowing a user 124 (e.g., a human operator or another entity) to configure or select a testing scenario (e.g., using predefined and/or user-defined templates), for generating and sending test traffic to SUT 122, for receiving response traffic from SUT 122, for configuring a testbed 113 comprising an emulated switching fabric implemented by one or more of network emulation platforms (NEPs) 114 and 116 and/or one or more physical or non-emulated testbed device(s) 118, a testbed transpiler for transpiling (e.g., generating) configuration information usable for configuring an emulated switching fabric to configuration information for one or more configuring testbed device(s) 118 and vice versa, and/or for analyzing one or more test results, and/or performance aspects associated with SUT 122.

In some embodiments, test system 100 may include one or more modules for performing various test related functions. For example, test system 100 may include a traffic engine or traffic generator for generating test traffic and/or may include various testing related applications or devices (e.g., a test analyzer or test configuration manager) for testing SUT 122 or related aspects. In this example, test system 100 may also include a central test controller (CTC) 102 for triggering and/or managing one or more test sessions associated with testbed 113, e.g., an emulated switching fabric provided by one or more NEPs 114 and 116.

In some embodiments, test system 100 or aspects thereof may be controlled or defined using one or more user-definable data models. For example, test system 100 may allow user 124 to configure or modify a resource allocator model, a switching model, a data center emulation or switching topology model, a traffic generator model, a network visibility model, a testbed model, etc. In this example, high-level or user-definable data models may be converted into lower-level data models or into computer readable instructions for implementing an emulated switching fabric environment using the user-definable data models and resources in one or more of NEPs 114 and 116.

SUT 122 may be any suitable entity or entities (e.g., devices, systems, or platforms) for receiving, processing, forwarding, and/or sending one or more messages (e.g., packets). In some embodiments, SUT 122 may include one or more logical or physical partitions. For example, SUT 122 may include a network node, a network switch, a network router, a network interface card, a packet forwarding device, or one or more virtual network functions (VNF). In this example, SUT 122 or a VNF thereof may be software in a virtual container (VC) or machine (VM) executing on shared resources (e.g., compute, storage, and network resources in a cloud computing environment). In some embodiments, nodes or a VNF of SUT 122 may include processing logic (e.g., rules associated with packet forwarding/processing) that is independent or separate from another portion of SUT 122 or another VNF.

SUT visibility tool 126 may be any suitable entity or entities (e.g., software executing on a processor, an ASIC, an FPGA, or a combination of software, an ASIC, or an FPGA) for monitoring, obtaining, and/or providing SUT performance or related visibility information (e.g., using virtual or physical probes or network taps). For example, SUT visibility tool 126 may include an application programming interface (API) based server or interface that provides collected SUT performance metrics or other related information to test system 100, CTC 102, packet analyzers, visibility modules, or other entities. In this example, SUT visibility tool 126 may obtain various SUT performance related data from one or more visibility related devices, applications, or nodes within or around SUT 122. Continuing with this example, SUT visibility tool 126 may generate performance reports or test analysis reports associated with SUT 122 and may send the reports to test system 100 or entities therein for analysis or other purposes. In another example, SUT visibility tool 126 may be a system with one or more processors (e.g., central processor units (CPUs)) for capturing packets and/or analyzing traffic or related performance, e.g., offline (e.g., after testing session) or online (e.g., during testing session).

Test system 100 may include CTC 102 for configuring testbed 113 or elements thereof for one or more test sessions. CTC 102 may be any suitable entity or entities (e.g., software executing on a processor, a field-programmable gateway array (FPGA), and/or an ASIC, or a combination of software, an FPGA, and/or an ASIC) for performing one or more aspects associated with configuring a test environment or a related testing scenario. In some embodiments, CTC 102 may be implemented using one or more processors and/or memory and may be a single device or node or may be distributed across multiple devices or nodes, e.g., cloud-based. For example, CTC 102 may act as a centralized, cloud-based entity for receiving user input related to setting up a testing scenario involving an emulated switching fabric environment via one or more UI(s) 104 and may use the user input for configuring NEPs 114 and 116 or other test system entities for the testing scenario. In another example, CTC 102 may send sets of configuration instructions to various modules or entities, e.g., one or more NEPs 114 and 116 and/or testbed device(s) 118, for setting up or configuring testbed 113 or a portion thereof, e.g., an emulated switching fabric and/or a physical testbed.

In some embodiments, CTC 102 may include a configuration manager (CM) 108. CM 108 may be any suitable entity or entities (e.g., software executing on a processor, an FPGA, and/or an ASIC, or a combination of software, an FPGA, and/or an ASIC) for performing one or more aspects associated with interfacing with user 124 and/or providing access to various test related services. In some embodiments, CM 108 may include an application programming interface (API) server or gateway and may be usable for providing one or more of UI(s) 104. For example, UI(s) 104 can be usable for provisioning test system 100, controlling test execution, and accessing or viewing test result information including emulated switching fabric environment performance information. In this example, user 124 may communicate with an API server or other test system entity via an external API that is implemented using a remote procedure call (RPC) protocol.

In some embodiments, CM 108 (or a related API server or gateway) may provide access to several test related services (e.g., traffic generation, visibility and switching fabric emulation, chassis resource, test session generation) with which the user can interact, provision, or control. For example, via one or more APIs or UI(s) 104 associated with CM 108, user 124 can provide test traffic generation requirements for a test session; provide or request test result performance metrics; provide data center or switching fabric emulation requirements or configurations; provide which of NEPs 114 and 116 or related resources are available for use in a test session; and/or provide test session definitions and associated configuration parameters.

In some embodiments, CTC 102, CM 108, and/or related entities may include or utilize one or more UI(s) 104 for receiving settings and/or configuration information for setting up a testing scenario or a related test session. For example, UI(s) 104 may include any interface usable by one or more types of user 124 (e.g., a human or another entity like an application, a machine, or a device) to interact with test system 100 or related entities. In some embodiments, one or more of UI(s) 104 may support automation e.g., via one or more programming languages (e.g., python), a REST API, an RPC API (e.g., a gRPC API), a command line interface (CLI), a machine-to-machine (M2M) automation interface, and/or a web based GUI.

In some embodiments, UI(s) 104 may include or utilize a GUI or other user interface for selecting and/or configuring emulated switching fabric environments and/or other related settings (e.g., test reporting and/or network visibility settings). For example, CTC 102 and/or CM 108 may provide a web based GUI for obtaining a test operator or another entity's intent for setting up or configuring testing scenarios and/or related emulated switching fabric environments. In this example, the web based GUI may be usable for visually defining a data center switching topology comprising one or more emulated switches and/or to indicate particular physical resources to allocate to each emulated switch. In another example, the web based GUI may be usable for gathering test session settings and/or for providing cabling instructions for interconnecting NEPs 114 and 116 or other entities associated with a test session or test system 100.

In some embodiments, CTC 102, CM 108, and/or related entities may include or utilize software (e.g., a distributed control and orchestration layer or a related API) that provides one or more interfaces for communicating with various test system entities (e.g., emulated and physical switches) for providing monitoring rules and/or related forwarding and/or routing rules of an emulated switching fabric environment.

In some embodiments, CTC 102, CM 108, and/or related entities may configure one or more of NEPs 114 and 116 to act as a switching fabric emulator. In such embodiments, the switching fabric emulator may be configured to provide emulated switches, e.g., by allocating a subset of resources from underlying switch processors (e.g., fixed-function or programmable switching chips, switching ASICs, etc.) to implement each emulated switch.

In some embodiments, CTC 102, CM 108, and/or related entities may configure testbed 113 or related elements. Testbed 113 may represent a infrastructure, a network, a switching fabric, or a group of devices used for communicating with SUT 122 during testing. For example, testbed 113 may include an emulated environment (e.g., an emulated switching fabric) comprising emulated elements provided by one or more of NEPs 114 and 116. In another example, testbed 113 may include a non-emulated environment (e.g., a physical testbed) comprising physical or non-emulated elements, such as testbed device(s) 118. In another example, testbed 113 may include a partially emulated environment (e.g., emulated switching elements in combination with one or more physical switches) comprising emulated elements provided by one or more of NEPs 114 and 116 and one or more of testbed device(s) 118.

In some embodiments, CM 108 may include or interact with testbed transpiler 109. Transpiler 109 may be any suitable entity or entities (e.g., software executing on at least one processor, an FPGA, and/or an ASIC, or a combination of software, an FPGA, and/or an ASIC) for performing aspects associated with transpiling (e.g., generating, deriving, converting, etc.) configuration information associated with an existing or prior testbed 113 into new or additional configuration information for configuring new or different elements in an updated testbed 113. For example, transpiler 109 may be a source code (e.g., a group of configuration settings, a configuration file, or a configuration script) to source code (e.g., a group of configuration settings, a configuration file, or a configuration script) compiler or converter. In another example, transpile device configuration settings from NEP 114 or NEP 116 associated with an emulated switching fabric comprising emulated TOR switches to derive configuration information for provisioning or assisting in provisioning real, physical TOR switches in testbed 113. In some embodiments, transpiler 109 may receive various input from user 124, SUT visibility tool 126, CTC 102, CM 108, and/or test related entities and may use this input in determining or selecting which portion(s) of testbed 113 to modify, e.g., by adding testbed device(s) 118 or by replacing emulated elements (e.g., emulated switches) with testbed device(s) 118.

In some embodiments, transpiler 109 or related entities (e.g., impairment controllers in NEPs 114-116) may include functionality for accessing predetermined or user-provided testbed device profiles. For example, testbed device profiles may include metadata (e.g., device attributes, configuration file formats, number of ports, capabilities, etc.) about various device models, NOSs, or related elements and the testbed device profiles may be stored (e.g., in storage 112) in a device profile store or repository. In this example, transpiler 109 or a related entity may use the physical device store when selecting testbed device(s) 118 for testbed 113 and generating configuring information for configuring selected testbed device(s) 118.

In some embodiments, transpiler 109 may include or utilize software that provides one or more interfaces for communicating with various test related entities (e.g., NEP visibility tools and/or SUT visibility tool 126) for obtaining existing test configuration information and/or test feedback information (e.g., performance related metrics related to a test session). In such embodiments, transpiler 109 may use the feedback information and test configuration information for determining whether and how to modify testbed 113, e.g., determine which emulated elements should be replaced with non-emulated elements, e.g., testbed device(s) 118.

In some embodiments, transpiler 109 may include or utilize software that provides one or more interfaces for communicating with user 124 for obtaining user preferences regarding testbed configuration or other user input. In some embodiments, transpiler 109 or another entity may allow user 124 to select (e.g., via a GUI) one or more testbed device(s) 118 from among a plurality of profiles in a device profile store. In another example, e.g., in lieu of user 124 selecting particular testbed device(s) 118 for testbed 113, user 124 may provide instructions indicating how transpiler 109 or CM 108 is to select testbed device(s) 118, e.g., a selection algorithm and/or related selection criteria.

Example user input for transpiler 109 may include emulated environment data (e.g., topology, capabilities, metadata, etc.) of existing or active testbed 113, user preferences (e.g., a selection technique or related criteria) for selection of testbed device(s) 118 for testbed 113, or information indicating user-selected testbed device(s) 118 for testbed 113.

In some embodiments, transpiler 109 may generate configuration information for configuring and/or setting up testbed device(s) 118. Testbed device(s) 118 may represent one or more physical and/or non-emulated network devices usable as an element of testbed 113. For example, testbed device(s) 118 may include a network node, a network switch, a network router, a whitebox switch, a programmable switch, or a packet forwarding device.

In some embodiments, transpiler-generated configuration information for configuring testbed device(s) 118 may include testbed physical device BOM information, topology information, device configuration parameter settings, guided setup instructions, cabling blueprints or diagrams, orchestration commands, configuration commands, setup related multimedia, configuration source files, or inter-device cabling information. For example, transpiler 109 may generate command and/or configuration instructions for automatically configuring a physical switch for use as an element in testbed 113 during testing of SUT 122 (e.g., without the user being aware of how a given physical device is configured). In another example, e.g., where a test operator must perform physical actions to connect a physical switch to testbed 113, transpiler 109 may generate or provide an interactive guided setup with video clips and instructions indicating how cables should be connected between the physical switch and other test related entities.

In some embodiments, CTC 102, CM 108, transpiler 109, and/or related entities may include or interact with one or more analysis and/or visibility modules (e.g., SUT visibility tool 126 and/or NEP visibility modules) for obtaining and processing performance metrics or related information (e.g., external or internal event data). In some embodiments, obtained performance metrics or related information may be used to adjust testbed 113 for subsequent test sessions. For example, after testing SUT 122 using a completely emulated testbed 113, CM 108 and/or transpiler 109 may determine, using test feedback information and user preferences, that one or more emulated elements are to be replaced with non-emulated elements, e.g., testbed device(s) 118. In this example, subsequent test sessions may be executed using the updated configuration of testbed 113 and feedback collected from the test sessions can be analyzed or compared with feedback collected from the test sessions associated with prior testbed configurations.

In some embodiments, CTC 102, CM 108, transpiler 109, and/or related entities may generate reports for indicating how SUT performance or other tested aspects are affected by different testbed configurations. For example, a test report may indicate how bandwidth or processing throughput is affected when testbed 113 is a completely emulated switching fabric, a partially emulated switching fabric, and a totally physical/real switching fabric. In another example, a test report may indicate whether or not traffic issues (e.g., drops, jitter, latency, etc.) increased or decreased based on the testbed configuration.

In some embodiments, CTC 102, CM 108, transpiler 109, and/or related entities may communicate or interact with a NEP resource allocator (NEPRA) 110. NEPRA 110 may be any suitable entity or entities (e.g., software executing on a processor, an FPGA, an ASIC, or a combination of software, an FPGA, and/or an ASIC) for performing one or more aspects associated with communicating with and/or controlling NEPs or related resources. For example, NEPRA 110 may include or utilize software (e.g., a distributed control and orchestration layer or related API) that provides an interface for communicating with NEPs 114 and 116 or other test system entities and may be effectively hidden from user 124.

In some embodiments, NEPRA 110 may allocate and manage resources of NEPs 114-118 for emulated switches and can be external or internal to CM 108. In some embodiments, NEPRA 110 may include a resource allocator function configured for accessing user-specified switching fabrication emulation requirements or specification information and NEP resource information (e.g., user input and/or pre-defined knowledge) and to effectively translate the user's declared data center switching fabric emulation specification into a mapping of NEP resources and associated physical resource allocations, e.g., ASIC switch resources in one or more of NEPs 114 and 116).

For example, after user 124 specifies a switching fabric environment to be emulated (e.g., based on a library of pre-defined switching fabric environments) and specifies that only NEPs 114 and 116 are available for use in emulating the target data center topology, NEPRA 110 (or a related resource allocator function) may access a NEP resource information database and generate a physical switch resource allocation map that is applied to the switching hardware (e.g., switching ASIC(s), system(s) on a chip (SoC), etc.) contained in NEP 114. In this example, the generated physical switch resource allocation map may effectively enable the switch resources in NEP 114 to emulate the user-specified target data center topology.

Continuing with the above example, if user 124 subsequently selects NEP 116 to be added to the emulated switching fabric environment, NEPRA 110 or a related entity (e.g., a resource allocator function) may generate a new or updated physical switch resource allocation map that is applied to the switching hardware contained in NEP 114, where the updated physical switch resource allocation map may effectively enables the switch resources in NEPs 114 and 116 to emulate the user-specified target data center topology.

In some embodiments, NEPRA 110 may include a logical to physical adaptor usable for converting and/or translating communications to refer to virtual or physical resources depending on the destination. For example, when requesting information about available switching resources via NEPRA 110, external applications, user 124, and/or SUT 122 may "see" a set of emulated switches each with a subset of resources instead of physical switches in one of NEPs 114 and 116. In this example, e.g., for NEP 114, logical to physical adaptor 212 may translate information about logical resources into information physical resources of a switch (e.g., a Tomahawk 3 series switch) and vice versa so that interacting nodes may remain unaware of the underlying switch(es) or related switch resources. Continuing with this example, e.g., for NEP 116, logical to physical adaptor 212 may translate information about logical resources into information physical resources of a different type of switch (e.g., a Tomahawk 4 series switch) and vice versa so that interacting nodes may remain unaware of the underlying switch (es) or related switch resources.

In some embodiments, NEPRA 110 may act as an orchestrator and reside between a device interface and interacting entities, e.g., SUT 122, testing applications in NEPs 114 and 116, or external devices. In such embodiments, NEPRA 110 may act as a communications proxy or agent using a logical interface and an intermediate protocol or API. For example, after a test session is completed, NEPRA 110 may receive a user-specified request for requesting emulated switch performance metrics and, in response, may process or translate the request using a relevant generated physical switch resource map to query or poll the appropriate switch resources (e.g., in NEPs 114 and 116) in order to obtain and/or synthesize the relevant emulated switching fabric performance information. In this example, the emulated switching fabric performance information may be accessible to user 124 via one or more API(s) or UI(s) 104.

In some embodiments, emulated switch performance data associated with various switching levels or stages and types of generated test traffic may be queried or polled (e.g., on-demand, at prescribed intervals, periodically during test execution, etc.) and stored by test system 100 or entities therein. In such embodiments, the emulated switch performance data may be accessible to user 124 via one or more API(s) or UI(s) 104.

In some embodiments, test system 100 or entities thereof (e.g., CTC 102 and/or NEPRA 110) may utilize communications interface(s) 106 for interacting with various entities. Communications interface(s) 106 may include or utilize any suitable entity or entities (e.g., one or more network interface cards (NICs), pluggable jacks, physical processors, transceiver modules, direct-attach cables (DACs) and/or other hardware) for sending or receiving communications. For example, communications interface(s) 106 (e.g., physical or virtual links) may allow CTC 102 or other entities (e.g., CM 108 or NEPRA 110) to send configuration information, settings, instructions, or other data to one or more of NEPs 114 and 116. In another example, communications interface(s) 106 (e.g., via physical or virtual links) may allow CTC 102 or other entities to receive test results or feedback from SUT visibility tool 126, NEP visibility tools, or other entities.

Each of NEPs 114 and 116 may include hardware and software usable for network emulation and/or switching fabric emulation. For example, each of NEPs 114 and 116 may be a distinct or separate chassis comprising an implementation of a particular switch processor (e.g., a switching ASIC, a system on a chip (SoC), custom hardware, an FPGA, a software switch, etc.), and dedicated data and control plane test traffic generation hardware resources (e.g., an FPGA, a CPU, a programmable data plane device like a P4 device, etc.). In some embodiments, NEPs 114 and 116 may be interconnected via various communication ports or links, e.g., 10 gigabit (10G) links, 25 gigabit (25G) links, 40 gigabit (40G) links, 100 gigabit (100G) links, etc.

In some embodiments, test system 100 or entities thereof (e.g., CTC 102, testing applications, transpiler 109, and/or NEPRA 110) may include functionality for accessing data storage 112. Data storage 112 may be any suitable entity or entities (e.g., a storage device, a non-transitory computer readable medium, or a storage system) for maintaining or storing information related to data center emulation, network testing, or related test analysis. For example, data storage 112 may include data center emulation data (e.g., NEP resources to emulated switches, physical to logical port mapping, physical buffers to virtual buffers mapping, etc.) and related policies (e.g., virtual and real port speed, virtual and real throughput, topologies, forwarding rules, classes of service, etc.) for sharing physical switch resources amongst the emulated switches.

In some embodiments, data storage 112 may also include testbed device profiles or a related repository, test traffic models, test sessions, test session data, topology information for emulated switching fabric environments and/or for SUT 122, and/or other information usable for generating performance metrics (e.g., statistics) associated with one or more aspects of SUT 122. In some embodiments, data storage 112 may be located at test system 100, another node, or distributed across multiple platforms or devices.

It will be appreciated that FIG. 1 is for illustrative purposes and that various depicted entities, their locations, and/or their functions described above in relation to FIG. 1 may be changed, altered, added, or removed. For example, a device (e.g., a computer including at least one processor coupled to a memory) may include functionality of CTC 102, CM 108, and NEPRA 110.

Figure 2:
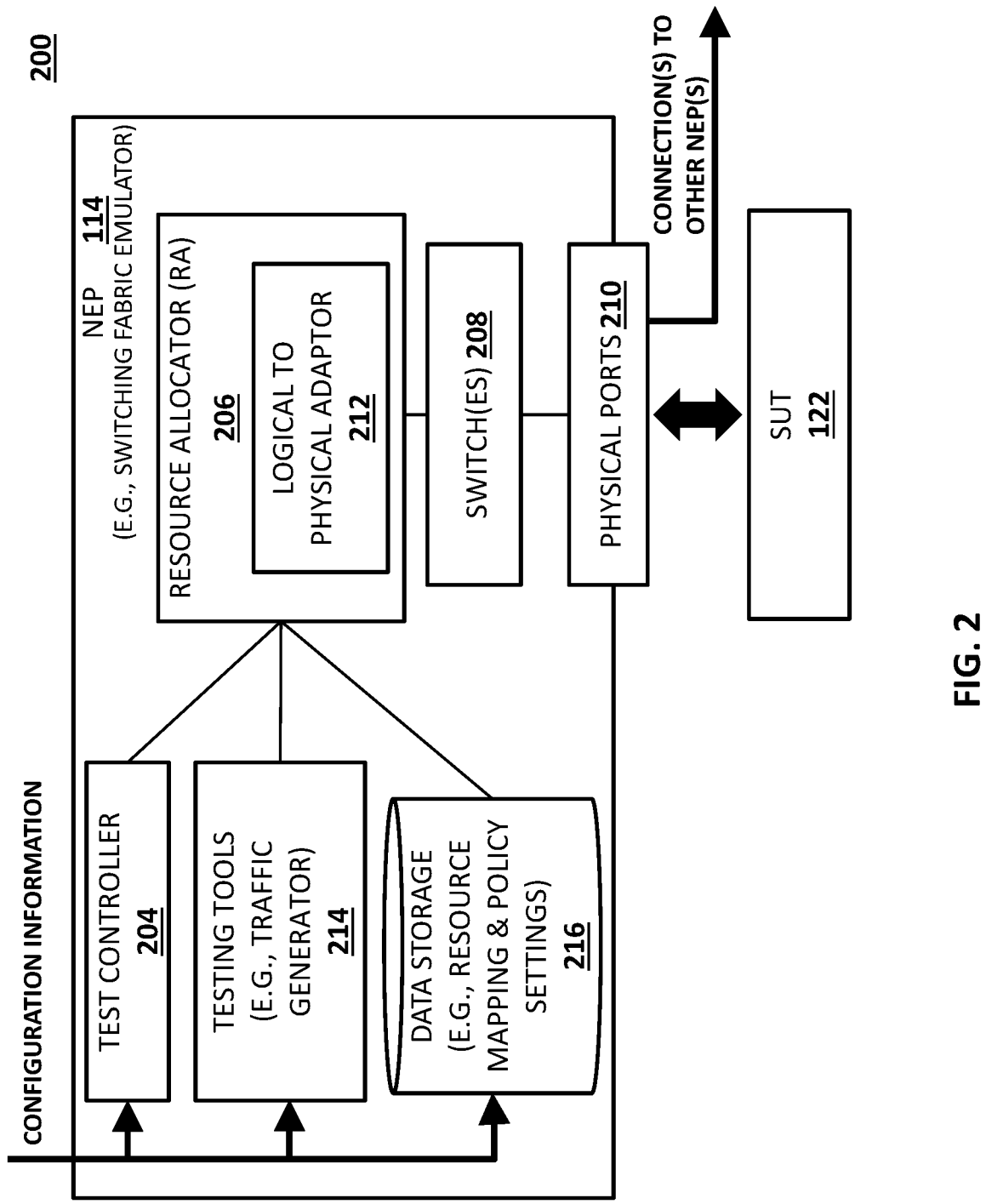
FIG. 2 is a diagram illustrating an example network emulation platform for emulating a switching fabric.

FIG. 2 is a diagram illustrating a test environment 200 comprising NEP 114. In some embodiments, NEP 114 may include a stand-alone tool, a testing device, a network equipment test device or platform, or software executing on one or more processor(s). In some embodiments, NEP 114 may be a single device or node (e.g., a chassis) and may include one or more modules for emulating a data center or a switching fabric environment and/or may include one or more modules for performing various test related functions associated with the emulated switching fabric environment.

In some embodiments, NEP 114 may be configured to interact with and/or to be configured by CTC 102 or related entities (e.g., CM 108 and/or NEPRA 110). For example, NEP 114, along with other NEPs, may receive particular configuration information from CTC 102 or a related entity via an internal test API. In this example, the configuration information received by NEP 114 may include configuration instructions for configuring NEP 114 or resources therein for use in a testing scenario, e.g., involving one or more test sessions. In another example, the configuration information received by NEP 114 may include test related emulation requirements that are used by NEP 114 or entities therein in generating corresponding or compliant commands or instructions for configuring NEP 114 or resources therein.

NEP 114 may include a test controller (TC) 204, resource allocator (RA) 206, switch(es) 208, ports 210, testing tools 214, and data storage 216. TC 204 may be any suitable entity or entities (e.g., software executing on a processor, an FPGA, and/or an ASIC, or a combination of software, an FPGA, and/or an ASIC) for performing one or more aspects associated with configuring resources in NEP 114 and/or for testing SUT 122. In some embodiments, TC 204 may be implemented using one or more processors and/or memory. For example, TC 204 may utilize one or more processors (e.g., executing software stored in memory) to generate traffic patterns or scenarios for various message streams (e.g., flows or sessions). In another example, TC 204 may also utilize one or more processors to perform or initiate various tests and/or analyses involving test packets and/or related responses from SUT 122. In this example, TC 204 may send instructions to various modules or entities in NEP 114, e.g., testing tools 214 for controlling (e.g., to pause, (re)start, or stop) a test session.

RA 206 may represent any suitable entity or entities (e.g., software executing on a processor, an FPGA, and/or an ASIC, or a combination of software, an FPGA, and/or an ASIC) for performing one or more aspects associated with resource allocation, e.g., allocating resources of switch(es) 208 for emulating elements of a switching fabric. For example, RA 206 may include the same or similar functionality described above with regard to a SARA for allocating resources of a switching ASIC. In this example, RA 206 may also include functionality for allocating resources of other types of switch(es) 208.

In some embodiments, TC 204 may utilize out-of-band and/or in-band ports and/or interfaces for communicating with entities of NEP 114 or test system 100, e.g., CTC 102. For example, in embodiments where TC 204 is external to RA 206, TC 204 may communicate with RA 206 via a management port or related interface.

In some embodiments, TC 204 may interact with one or more testing tools 214. Testing tools 214 may represent software or hardware for testing SUT 122 and/or for performing various test related functions, e.g., performance monitoring, test traffic generation, and test analysis. In some embodiments, testing tools 214 can include, but are not limited to, visibility modules (e.g., packet analyzers), traffic generators, SDN controller applications, GUI and CLI applications, and/or test traffic generation applications for communicating with SUT 122 and/or emulation related tools.

In some embodiments, NEP 114 or aspects thereof may be controlled or defined using one or more user-definable data models. For example, CTC 102 may provide a GUI for allowing user 124 to configure or modify a RA model, a switching model, a switching fabric topology model, a traffic generator model, a network visibility model, etc. used in a testing scenario or a related emulated switching fabric environment. In this example, CTC 102 may send, to TC 204, high-level or user-definable data models indicating a switching fabric topology comprising one or more emulated switches and/or may indicate particular physical resources to allocate to each emulated switch. Continuing with this example, TC 204 or RA 206 may convert these data models into lower-level data models or related computer readable instructions for implementing an emulated switching fabric environment in accordance with the user-definable data models.

In some embodiments, testing tools 214 may include or utilize settings and/or configuration information from CTC 102 or another source for setting up a data center related testing scenario or a related test session. For example, received settings and/or configuration information may be usable for generating and sending test traffic that is different from or similar to traffic sent by SUT 122 during a test session. In another example, received settings and/or configuration information may be usable for instructing visibility infrastructure components for monitoring traffic and/or performance aspects associated with a testing scenario or a related emulated switching fabric environment.

In some embodiments, testing tools 214 may include or utilize a traffic engine or traffic generator. For example, a traffic generator may generate test traffic that is directed to traverse emulated logical switches or an emulated switching fabric environment. The emulated switching fabric environment may be configured so as to emulate a particular switching fabric or topology. In some embodiments, a traffic generator may include one or more test traffic receivers (e.g., test receive ports) that are configured to receive the test traffic and generate test metric information, which may be accessible to a visibility module of test system 100.

In some embodiments, testing tools 214 may include or utilize a visibility module and/or a related analyzer. In such embodiments, the visibility module and/or the related analyzer may be configurable by TC 204 for monitoring performance or telemetry information in a particular emulated switching fabric environment or topology. For example, a visibility module may be any suitable entity or entities (e.g., software executing on a processor, an ASIC, an FPGA, or a combination of software, an ASIC, or an FPGA) for maintaining network visibility (e.g., using virtual or physical probes or network taps). In this example, virtual taps or software may be configured to provide switch metrics or other information (e.g., network telemetry, switch and/or link status information, etc.) associated with one or more elements (e.g., emulated switches) of an emulated switching fabric environment. Continuing with this example, the visibility module may generate performance reports or test analysis reports associated with SUT 122, e.g., by utilizing the switch metrics or other information associated with packets that pass through or are generated by SUT 122.

In some embodiments, a visibility module may be configured for obtaining emulated logical switch performance metric information associated with a test session by polling RA 206 or another test system entity. For example, by polling for logical switch performance metric information associated with a test session, user 124 may observe how the operation of SUT 122 impacts the emulated switching fabric environment during a test run or session. Polling logical switch performance metric information associated with a test session may also be used for observing how conditions in the emulated switching fabric environment impact the DUT/SUT during a test run or session.

In some embodiments, a visibility module may be configured to obtain or generate telemetry or operational performance data associated with the emulated switches during the execution of a test session involving SUT 122. In such embodiments, the visibility module may correlate the telemetry or operational performance data with SUT endpoint operational activities and events (e.g., SUT operational actions as defined in a test session) and may report performance data and/or correlated SUT endpoint information to user 124.

Switch(es) 208 may represent one or more switch processors (e.g., a fixed-function or programmable ASIC or SoC) and may include additional hardware, firmware, and/or software for performing one or more functions associated with network switching. For example, switch(es) 208 may utilize an ASIC pipeline for performing frame or packet forwarding, e.g., sending a packet received from one port out another port of the switch. In some embodiments, various resources (e.g., lookup tables or match-action tables used for forwarding decisions, traffic manager buffer memory, traffic manager logical queues, etc.) of switch(es) 208 may be managed and/or allocated to provide emulated switches by RA 206.

Ports 210 may include or utilize any suitable entity or entities (e.g., one or more network interface cards (NICs), pluggable jacks, physical processors, transceiver modules, direct-attach cables (DACs) and/or other hardware) for sending or receiving communications. For example, TC 204 or RA 206 may configure one or more of ports 210 (e.g., physical connections) for receiving and sending various types of test packets or related data units; such as IP messages, Ethernet messages, packet data units (PDUs), datagrams, user datagram protocol (UDP) messages, transmission control protocol (TCP) messages, IP version 4 (v4) messages, IP version 6 (v6) messages, stream control transmission protocol (SCTP) messages, real-time transport protocol (RTP) messages, or reliable data protocol (RDP) messages, messages using a tunneling protocol, and/or other data units.

In some embodiments, ports 210 may include user traffic ports and management ports. For example, user traffic ports may be associated with processing, sending, and/or receiving test traffic, non-test traffic, and/or in-band management related communications and management ports may be associated with processing, sending, and/or receiving out-of-band management related communications.

In some embodiments, ports 210 may include multiple port modules or groups of ports for interacting with SUT 122. For example, depending on a test operator's configuration settings or a particular test session setup, RA 206 may allocate a portion of physical resources to each switch that is emulated, where the emulated switches are collectively used to mimic a data center switching fabric. In some embodiments, each emulated switch may be allocated or associated with one or more of ports 210 and the port association may be static or semi-static (e.g., particular ports may be assigned to an emulated switch for a given test session).

In some embodiments, RA 206 may be any suitable entity or entities (e.g., software executing on a processor, an FPGA, an ASIC, or a combination of software, an FPGA, and/or an ASIC) for performing one or more aspects associated with allocating resources to emulated switches and/or managing emulated switches. In some embodiments, RA 206 may allocate and manage resources of switch(es) 208 for providing emulated switches without requiring a custom ASIC pipeline. In some embodiments, RA 206 can be external or internal to switch(es) 208.

In some embodiments, RA 206 may utilize one or more management ports or related interfaces for communicating with a controller or related applications (e.g., CTC 102, TC 204 and/or testing tools 214) and/or for communicating with switch(es) 208. For example, TC 204 or a related application may communicate with RA 206 via an out-of-band management port or related interface. In this example, RA 206 may send instructions or other communications to switch(es) 208 via another management port or related interface.

In some embodiments, RA 206 may include a logical to physical adaptor 212. Logical to physical adaptor 212 may be any suitable entity or entities (e.g., software executing on a processor, an FPGA, an ASIC, or a combination of software, an FPGA, and/or an ASIC) for converting and/or translating communications to refer to logical (e.g., virtual) or physical resources depending on the destination. For example, when requesting information about available switching resources via RA 206, testing tools 214 and/or SUT 122 may "see" a set of emulated switches each with a subset of resources instead of switch(es) 208. In this example, logical to physical adaptor 212 may translate information about logical resources into information about physical resources of a single switch (e.g., Tomahawk 3) and vice versa so that interacting nodes may remain unaware of the underlying switch(es) 208 or related switch resources.

In some embodiments, RA 206 and/or logical to physical adaptor 212 may reside between a native device interface and interacting entities (e.g., SUT 122, testing tools 214, or external devices) and may act as a communications proxy or agent using a logical interface. For example, SUT 122 may include a network switch controller that configures switching resources by sending, via a logical interface associated with RA 206, configuration requests for requesting and/or configuring one or more switches. In this example, RA 206 and/or logical to physical adaptor 212 may translate the configuration requests received via the logical interface into one or more corresponding requests for transmission via a native switch interface, where the corresponding requests include commands for configuring appropriate physical resources of underlying switch(es) 208. Further, RA 206 and/or logical to physical adaptor 212 may translate switch performance results coming from a native switch interface into virtualized results (e.g., link status or counter values for a physical port '3' may be changed to values for a logical port 'v1' of an emulated switch 'TORSW1') before sending the virtualized results to the network switch controller via the logical interface.

In some embodiments, RA 206 and/or logical to physical adaptor 212 may create, store, and/or use switching ASIC emulation data (e.g., physical to logical port mapping, physical buffers to virtual buffers mapping and resource allocation, etc.) and related policies (e.g., virtual and real port speed, virtual and real throughput, topologies, forwarding rules, classes of service, etc.) for sharing physical switch resources amongst the emulated switches. For example, by using port mapping data and policies stored in data storage 216, logical ports 'v1', 'v2', 'v3' on an emulated switch 'TORSW1' may be translated into physical ports '3', '4', '5', respectively. In this example, configuration commands for setting speed of port 'v1' can be translated so that the speed of corresponding physical port '3' is set. Continuing with this example, to query the statistical counters for logical port 'v1', the statistical counters for physical port '3' may be queried.

In some embodiments, RA 206 and/or logical to physical adaptor 212 may utilize a modified proprietary (e.g., vendor) API (e.g., a vendor's software development kit (SDK) or by utilizing a wrapper API that interacts with a vendor API. For example, by using a wrapper API, RA 206 can manage a fleet of emulated switches using off-the-shelf or commodity ASICs with network operating systems (NOSs) that utilize a proprietary or vendor API.

In some embodiments, RA 206 and/or logical to physical adaptor 212 may utilize a custom adaptor that handles certain applications or functions which may involve a subset of resource management and mapping requirements than a standard switching API. For example, by using a custom adaptor, RA 206 can manage a fleet of emulated switches for certain use cases using off-the-shelf or commodity ASICs.

In some embodiments, NEP 114 or entities thereof (e.g., TC 204, testing tools 214, and/or RA 206) may include functionality for accessing data storage 216. Data storage 216 may be any suitable entity or entities (e.g., a storage device, a non-transitory computer readable medium, or a storage system) for maintaining or storing information related to switching ASIC emulation, network testing, or related test analysis. For example, data storage 216 may include switching ASIC emulation data (e.g., physical to logical port mapping, physical buffers to virtual buffers mapping, etc.) and related policies (e.g., virtual and real port speed, virtual and real throughput, topologies, forwarding rules, classes of service, etc.) for sharing physical switch resources amongst the emulated switches. Data storage 216 may also include test traffic models, test sessions, test session data, topology information for emulated switching fabric environments, information usable for generating performance metrics (e.g., statistics) associated with one or more aspects of SUT 122, and/or other information associated with testing SUT 122. In some embodiments, data storage 216 may be located at NEP 114, another node, or distributed across multiple platforms or devices.

It will be appreciated that FIG. 3 is for illustrative purposes and that various depicted entities, their locations, and/or their functions described above in relation to FIG. 3 may be changed, altered, added, or removed. For example, NEP 114 may include a chassis or rack including one or more computers (e.g., blade computers) each including at least one processor coupled to a memory, e.g., data storage 216. In this example, each server may include functionality of TC 204, RA 206, and/or testing tools 214.

Figure 3:
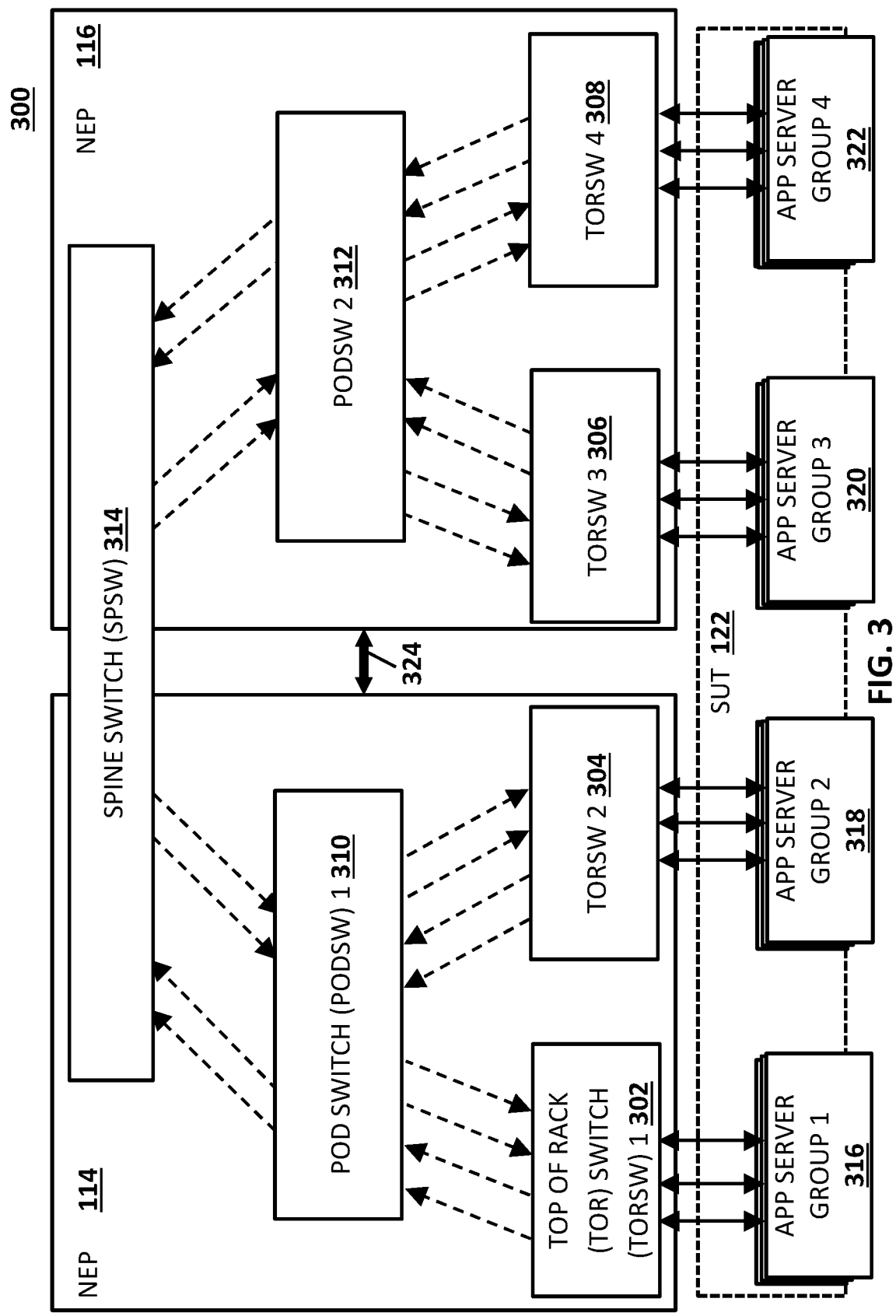
FIG. 3 is a diagram illustrating an example emulated switching fabric usable for network testing.

FIG. 3 is a diagram illustrating an example emulated switching fabric 300 usable for network testing. Emulated switching fabric 300 may represent a switching fabric comprising a network of emulated switches (e.g., traffic forwarding devices) for forwarding packets from or to SUT 122 or other entities, where the emulated switches may be connected via a particular (e.g., user-defined) logical topology. For example, emulated switching fabric 300 may be implemented using resources (e.g., switches 208) of NEPs 114 and 116 and configured based on user input and/or predetermined environment templates or data models, e.g., stored in data storage 216.

In some embodiments, e.g., where emulated switching fabric 300 uses multiple NEPs (e.g., NEPs 114 and 116), physical connections or links may be used for communicatively connecting NEPs or physical resources therein. For example, each of NEPs 114 and 116 may use one or more of its physical ports 210 for interconnecting or linking with other NEPs, e.g., via 40G or 100G links. In another example, each of NEPs 114 and 116 may be communicatively connected via wireless transceivers.

Referring to FIG. 3, emulated switching fabric 300 may represent a 3-stage Clos switching network comprising various stages of emulated switches, wherein each emulated switch is implemented using physical resources of NEP 114 and/or 116. As depicted in FIG. 3, stage one switches of emulated switching fabric 300 include top of rack (TOR) switches (TORSWs) 302 and 304 implemented using NEP 114 and TORSWs 306 and 308 implemented using NEP 116. Stage two switches of emulated switching fabric 300 include cluster or pod switch (PODSW) 310 implemented using NEP 114 and PODSW 312 implemented using NEP 116. Stage three of emulated switching fabric 300 includes a spine switch (SPSW) 314 implemented using both NEP 114 and 116. In some embodiments, TORSWs 302-308 may represent or emulate switches that are connected to multiple servers (e.g., located within a rack or nearby rack), POD-SWs 310-312 may each represent or emulate an aggregation switch that is connected to multiple TORSWs, and SPSW 314 may represent or emulate a higher-level aggregation switch that is connected to multiple PODSWs.

In FIG. 3, virtual or logical links between emulated switches (or portions thereof) implemented on a single NEP (e.g., links between PODSW1 310 and TORSW1 302) are shown as unidirectional links and may utilize loopback connections. While not shown in FIG. 3, virtual links between emulated switches implemented on different NEPs may be bidirectional links and may utilize one or more physical cable(s) 324 connected via physical ports of NEPs 114 and 116. Similarly, communications between an emulated switch (e.g., SPSW 314) implemented across NEPs 114 and 116 may traverse physical cable(s) 324 and may be bilateral in nature; however such inter-NEP, intra-emulated switch communications may be transparent to endpoints and/or elements of emulated switching fabric 300.

In some embodiments, characteristics (e.g., bandwidth, capacity, supported protocols, or processing speed or throughput) of emulated switches may be varied as defined by test configuration information or related settings. For example, each of NEPs 114 and 116 may include a different brand, type, and/or version of switches 208 and/or other hardware. In this example, depending on user input and/or configuration information, NEPRA 110 may indicate which NEP is to emulate which emulated switches based on NEP capabilities and user requirements for emulated switching fabric 300.

In some embodiments, some physical ports of switch(es) 208 of NEPs 114 and 116 may be associated with different emulated switches and may utilize loopback interfaces or internal interfaces for emulating communications between some emulated switches, while other emulated switches (e.g., TORSWs 302-308) may utilize physical interfaces and/or physical cabling for communicating with SUT 122 or portions thereof.

In some embodiments, SUT 122 may represent or include a set of application server groups 316-322, each representing one or more servers and/or applications. For example, application server group 1 316 may include multiple servers (e.g., 16 or more servers in a single rack), each having one or more connections to a TOR switch. In some examples, a server of application server groups 316-322 may include multiple applications or perform different services (e.g., machine learning (M/L), storage offload, search engines, webpages, video streaming, email, etc.) for users or may perform similar services for different sets of users. In some examples, a server of application server groups 316-322 may act as a client to another server.

In some embodiments, each of application server groups 316-322 may be connected (e.g., physically cabled) to a distinct set of physical ports 210 of switch(es) 208 in NEP 114 or NEP 116, where each set of physical ports 210 is assigned or allocated to a particular emulated switch. For example, RA 206 of NEP 114 may assign particular physical ports (e.g., '1', '2', and '3') to an emulated switch 'TORSW1' and may virtualize those physical ports as corresponding virtual ports (e.g., '3', '4', and '5', respectively). In this example, applications and/or servers in application server group 1 316 may be communicatively coupled to one or more of the logical ports of the emulated switch 'TORSW1'.

In some embodiments, configuration information may include any suitable information for mapping logical ports associated with emulated switching fabric 300 to physical ports of switch(es) 208 in one of NEPs 114 and 116. In some embodiments, configuration information may be stored or maintained in data storage 216 and may be usable for translating port information or related information in switch configuration commands, performance metrics, and/or other communications.

It will be appreciated that FIG. 3 is for illustrative purposes and that various depicted entities, their locations, and/or their functions described above in relation to FIG. 3 may be changed, altered, added, or removed.

Figure 4:
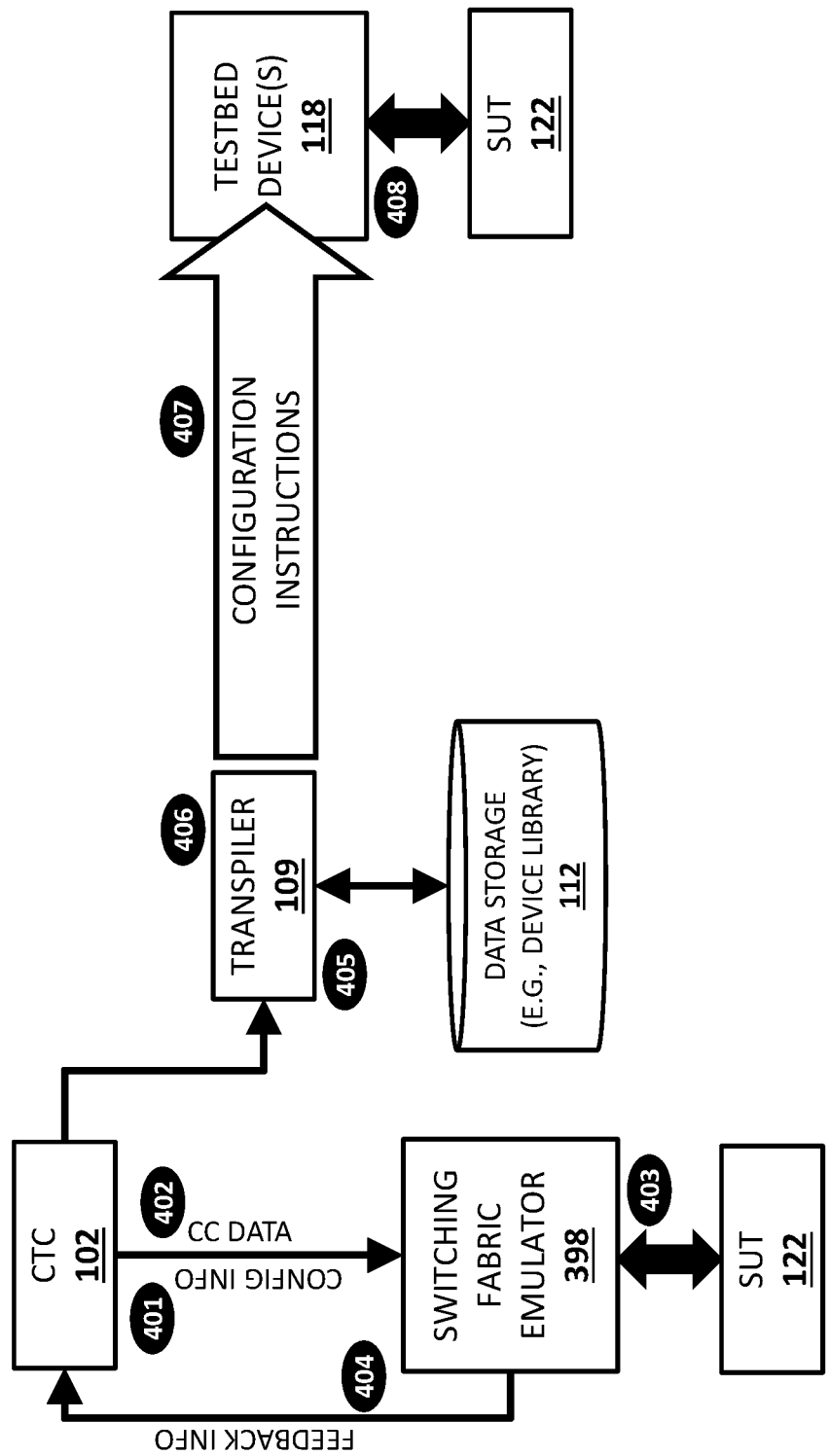
FIG. 4 is a diagram illustrating an example test scenario comprising an example testbed transpiler.

FIG. 4 is a diagram illustrating an example scenario 400 where transpiler 109 generates configuration instructions for one or more of testbed device(s) 118. In some embodiments, test system 100, CM 108, transpiler 109, and/or other entities may modify testbed 113 to include and/or remove various types of testbed elements. For example, test system 100 may initially setup and configure testbed 113 as a completely emulated environment (e.g., emulated switching fabric 300). In this example, using various input (e.g., existing configuration information and/or information about available testbed device(s) 118), CM 108 and/or transpiler 109 may generate configuration instructions and/or other information for modifying testbed 113 to replace some or all of the emulated elements (e.g., emulated TOR switches 302-308) with physical or non-emulated elements (e.g., a series of interconnected whitebox switches) having the same or similar functionality as the replaced emulated elements.

Referring to FIG. 4, scenario 400 may involve modifying testbed 113 comprising emulated switching fabric 300 implemented by a switching fabric emulator 398 (e.g., a hardware-based emulator device, such as one or more NEPs 114 and 116) to include, in lieu of or in combination with emulated switching fabric 300 (or a version thereof), a physical testbed comprising physical or non-emulated testbed elements(s), e.g., testbed device(s) 118. In some embodiments, scenario 400 may involve transpiler 109 receiving input (e.g., user input and/or feedback information from test related entities) and test configuration information (e.g., for configuring switching fabric emulator 398) and transpiling (e.g., converting) the configuration information or a portion thereof into testbed device configuration information for configuring testbed device(s) 118.

Referring to scenario 400, in step 401, CTC 102 or another entity may receive user input related to configuring a test environment (e.g., testbed 113) and may use this information to generate and send configuration instructions to switching fabric emulator 398 (e.g., one or more of NEPs 114 and 116) of test system 100 for configuring an emulated switching fabric 300 for the test environment.

In step 402, after switching fabric emulator 398 is configured, CTC 102 or another entity may communicate command and control instructions associated with a test session to switching fabric emulator 398. For example, the switching fabric emulator or testing tools 214 may be configured to initiate a test session by sending predetermined test traffic to SUT 122.

In step 403, switching fabric emulator 398 or a related entity therein (e.g., a test traffic generator or testing tools 214) may communicate with SUT 122 during one or more test sessions.

In optional step 404, CTC 102 or another entity may receive feedback information (e.g., emulated fabric performance metrics) from switching fabric emulator 398 or other test related entities (e.g., SUT visibility tool 126) and may subsequently use the feedback information to adjust or refine switching fabric emulator configuration settings or other information during one or more test sessions.

In step 405, after executing one or more test sessions utilizing switching fabric emulator 398, user 124 may send input indicating that the test environment should be modified to utilize a physical testbed comprising testbed device(s) 118, e.g., by replacing some or all of emulated switching fabric 300 provided by switching fabric emulator 398 with one or more testbed device(s) 118, e.g., physical or non-emulated fabric switch device(s).

In step 406, transpiler 109 or a related entity of test system 100 may use received input, one or more testbed device profiles (e.g., device attributes, capabilities, metadata, etc.) from a device profile store (e.g., located in storage 112), and/or existing test configuration information (e.g., emulator configuration settings and/or metadata from switching fabric emulator 398) to generate testbed device configuration information (e.g., testbed device BOM information, testbed topology information, testbed device configuration parameter settings, configuration files, configuration scripts, connection diagrams, inter-device cabling information, setup instructions, etc.) for configuring testbed device(s) 118.

In step 407, transpiler 109 or a related entity of test system 100 may export, provide, or send testbed device configuration information to testbed device(s) 118 or another entity for manually or automatically assembling and configuring testbed device(s) 118 or a related physical testbed connecting SUT 122 and one or more testing tools or applications.

In step 408, after testbed device(s) 118 is configured for use in testing SUT 122, test system 100 or a related entity may initiate one or more test sessions that utilize testbed device(s) 118 when testing SUT 122.

It will be appreciated that FIG. 4 is for illustrative purposes and that various depicted entities, their locations, and/or their functions described above in relation to FIG. 4 may be changed, altered, added, or removed. It will also be appreciated that steps 401-408 are for illustrative purposes and that different and/or additional actions may be used.

Figure 5:
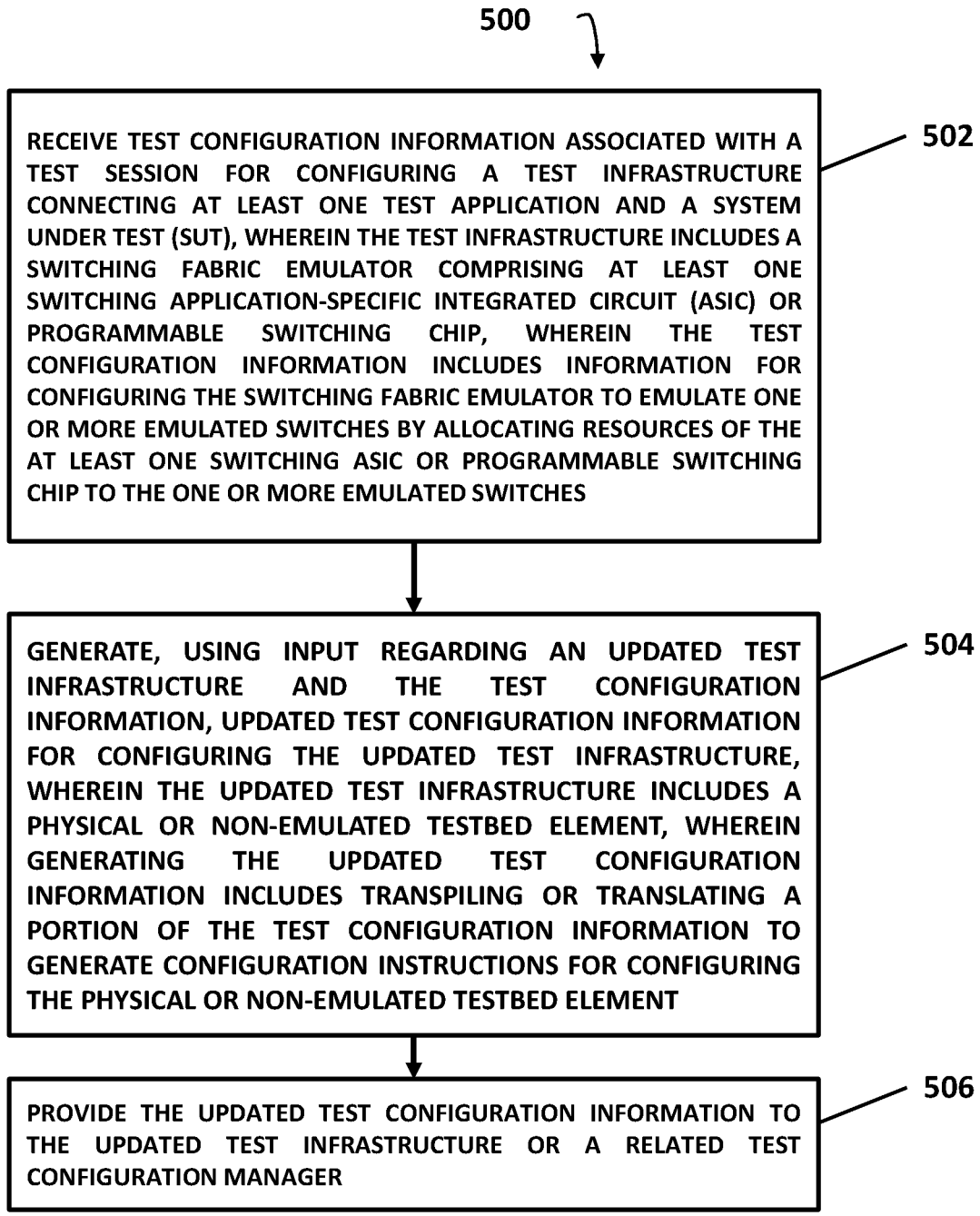
FIG. 5 is a diagram illustrating an example process for using a testbed transpiler.

FIG. 5 is a diagram illustrating an example process 500 for using a testbed transpiler. In some embodiments, process 500, or portions thereof, may be performed by or at test system 100, CTC 102, CM 108, NEPRA 110, one or more of NEPs 114 and 116, testing tools 214, and/or another node or module. In some embodiments, process 500 may include steps 502, 504, and 506.

In some embodiments, process 500 may occur at a testbed transpiler (e.g., transpiler 109) of a network test system (e.g., test system 100) implemented using at least one processor. In some embodiments, process 500 may occur before, after, during or concurrently with a test session implemented or facilitated by test system 100 or other entities.

Referring to process 500, in step 502, test configuration information associated with a test session for configuring a test infrastructure connecting at least one test application and SUT 122 may be received.

In some embodiments, a test infrastructure (e.g., configured using test configuration information) may include a switching fabric emulator (e.g., one or more of NEPs 114 and 116) comprising at least one switch processor (e.g., a switching ASIC or a fixed-function or programmable switching chip). In such embodiments, the test configuration information may include information for configuring the switching fabric emulator to emulate one or more emulated switches (e.g., e-switches 302-314) by allocating resources of the switch processor (e.g., a switching ASIC or a fixed-function or programmable switching chip) to the one or more emulated switches.

In step 504, updated test configuration information for configuring the updated test infrastructure may be generated, using input regarding an updated test infrastructure and the test configuration information, wherein the updated test infrastructure may include a physical or non-emulated testbed element, wherein generating the updated test configuration information may include transpiling or translating a portion of the test configuration information to generate configuration instructions for configuring the physical or non-emulated testbed element. For example, transpiler 109 may receive input (e.g., a test operator's instructions or preferences regarding changing a testbed to include testbed device(s) 118 and/or feedback information from test system 100, SUT 122, or test related entities) and an existing testbed's configuration information. In this example, transpiler 109 may use this information in generating test device configuration instructions for configuring testbed device(s) 118 (e.g., a P4 programmable switch or a smart-switch) within testbed 113.

In step 506, the updated test configuration information may be provided to the updated test infrastructure or a related test configuration manager (e.g., in test system 100 or in testbed device(s) 118). For example, after generating test device configuration instructions for configuring testbed device(s) 118 (e.g., a P4 programmable switch or a smart-switch) within testbed 113, transpiler 109 may send the test device configuration instructions to testbed device(s) 118 via a configuration API or may send or provide the instructions to another device for configuring testbed device(s) 118.

In some embodiments, a test controller (e.g., CTC 102) of test system 100 may be configured for initiating a test session, where the test session involves using an updated test infrastructure (e.g., testbed 113) and at least one test application (testing tools 214) to test SUT 122 and may obtain and report test results (e.g., to user 124) associated with the test session.

In some embodiments, input (e.g., used by transpiler 109 to transpile test configuration information into physical testbed device configuration instruction) may include feedback information from one or more test system elements (e.g., SUT 122, NEPs 114 and 116, or visibility tools) and/or may include declarative or intent-based user input associated with one or more predetermined device profiles (e.g., stored in storage 112) associated with available physical or non-emulated testbed elements (e.g., testbed device(s) 118).

In some embodiments, at least one predetermined device profile (e.g., stored in storage 112) may include or indicate device attributes, device availability, device status, compatible configuration file formats, port information, locations of ports, device capabilities, device identifiers, vendor model, operating system or software information, or preconfigured or default settings.

In some embodiments, declarative or intent-based user input may include a selection, by user 124 and via UI(s) 104, of a physical or non-emulated testbed element (e.g., testbed device(s) 118) to be added to an updated test infrastructure (e.g., testbed 113) from among one or more predetermined device profiles (e.g., in storage 112) accessible by the network test system (e.g., test system 100).

In some embodiments, declarative or intent-based user input may include user preferences and may indicate that an existing test infrastructure should be changed and a network test system (e.g., test system 100) or a related entity (e.g., transpiler 109 or CTC 102) uses the declarative or intent-based user input to automatically select a physical or non-emulated testbed element (e.g., testbed device(s) 118) to be added to an updated test infrastructure.

In some embodiments, transpiler-generated configuration instructions may be based on configuration settings, capabilities, or metadata indicated by a device profile (e.g., stored in storage 112) associated with a physical or non-emulated testbed element (e.g., testbed device(s) 118).

In some embodiments, transpiler-generated configuration instructions may include testbed physical device BOM information, topology information, device configuration parameter settings, guided setup instructions, orchestration commands, configuration commands, setup related multimedia, configuration source files, or inter-device cabling information.

In some embodiments, a physical or non-emulated testbed element (e.g., testbed device(s) 118) may include a network node, a network switch, a network router, a whitebox switch, or a programmable switch.

It will be appreciated that process 500 is for illustrative purposes and that different and/or additional actions may be used. It will also be appreciated that various actions described herein may occur in a different order or sequence.

It should be noted that test system 100, CTC 102, CM 108, NEPRA 110, NEPs 114 and 116, switching fabric emulator 398, and/or functionality described herein may constitute one or more special purpose computing devices. Further, test system 100, CTC 102, CM 108, NEPRA 110, NEPs 114 and 116, switching fabric emulator 398, and/or functionality described herein can improve the technological field of testing networks and related nodes by providing mechanisms, systems, methods, and/or techniques for transpiling configuration information for an existing or prior configuration of testbed 113 (e.g., information for configuring emulated switching fabric 300) into different configuration information for a modified configuration of testbed 113 (e.g., information for configuring physical, non-emulated testbed device(s) 118, such as whitebox switches, to be added to testbed 113).

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter.

What is claimed is:

1. A method for using a testbed transpiler, the method comprising:
at the testbed transpiler of a network test system implemented using at least one processor:
receiving test configuration information associated with a test session for configuring a test infrastructure connecting at least one test application and a system under test (SUT), wherein the test infrastructure includes a switching fabric emulator comprising at least one switching application-specific integrated circuit (ASIC) or programmable switching chip, wherein the test configuration information includes information for configuring the switching fabric emulator to emulate one or more emulated switches by allocating resources of the at least one switching ASIC or programmable switching chip to the one or more emulated switches;
generating, using input regarding an updated test infrastructure and the test configuration information, updated test configuration information for configuring the updated test infrastructure, wherein the updated test infrastructure includes a physical or non-emulated testbed element, wherein generating the updated test configuration information includes transpiling or translating a portion of the test configuration information to generate configuration instructions for configuring the physical or non-emulated testbed element; and
providing the updated test configuration information to the updated test infrastructure or a related test configuration manager.

2. The method of claim 1 comprising:
at a test controller of the network test system:
initiating the test session, wherein the test session involves using the updated test infrastructure and the at least one test application to test the SUT; and
obtaining and reporting test results associated with the test session.

3. The method of claim 1 wherein the input includes feedback information from one or more test system elements and/or declarative or intent-based user input associated with one or more predetermined device profiles associated with available physical or non-emulated testbed elements.

4. The method of claim 3 wherein at least one of the one or more predetermined device profiles indicates device attributes, device availability, device status, compatible configuration file formats, port information, locations of ports, device capabilities, device identifiers, vendor model, operating system or software information, or preconfigured or default settings.

5. The method of claim 3 wherein the declarative or intent-based user input includes a selection, by the user and via a user interface, of the physical or non-emulated testbed element to be added to the updated test infrastructure from among the one or more predetermined device profiles accessible by the network test system.

6. The method of claim 3 wherein the declarative or intent-based user input includes user preferences and indicates that the updated test infrastructure should be changed and the network test system or a related entity uses the declarative or intent-based user input to automatically select the physical or non-emulated testbed element to be added to the updated test infrastructure.

7. The method of claim 1 wherein the configuration instructions are based on configuration settings, capabilities, or metadata indicated by a device profile associated with the physical or non-emulated testbed element.

8. The method of claim 1 wherein the configuration instructions include testbed device bill of materials (BOM) information, topology information, device configuration parameter settings, guided setup instructions, orchestration commands, configuration commands, setup related multimedia, configuration source files, or inter-device cabling information.

9. The method of claim 1 wherein the physical or non-emulated testbed element includes a network node, a network switch, a network router, a whitebox switch, or a programmable switch.

10. A system for using a testbed transpiler, the system comprising:
  at least one processor; and
  a memory; and
  the testbed transpiler of a network test system implemented using the at least one processor and the memory, the testbed transpiler configured for:
    receiving test configuration information associated with a test session for configuring a test infrastructure connecting at least one test application and a system under test (SUT), wherein the test infrastructure includes a switching fabric emulator comprising at least one switching application-specific integrated circuit (ASIC) or programmable switching chip, wherein the test configuration information includes information for configuring the switching fabric emulator to emulate one or more emulated switches by allocating resources of the at least one switching ASIC or programmable switching chip to the one or more emulated switches;
    generating, using input regarding an updated test infrastructure and the test configuration information, updated test configuration information for configuring the updated test infrastructure, wherein the updated test infrastructure includes a physical or non-emulated testbed element, wherein generating the updated test configuration information includes transpiling or translating a portion of the test configuration information to generate configuration instructions for configuring the physical or non-emulated testbed element; and
    providing the updated test configuration information to the updated test infrastructure or a related test configuration manager.

11. The system of claim 10 comprising:
  a test controller of the network test system configured for:
    initiating the test session, wherein the test session involves using the updated test infrastructure and the at least one test application to test the SUT; and
    obtaining and reporting test results associated with the test session.

12. The system of claim 10 wherein the input includes feedback information from one or more test system elements and/or declarative or intent-based user input associated with one or more predetermined device profiles associated with available physical or non-emulated testbed elements.

13. The system of claim 12 wherein at least one of the one or more predetermined device profiles indicates device attributes, device availability, device status, compatible configuration file formats, port information, locations of ports, device capabilities, device identifiers, vendor model, operating system or software information, or preconfigured or default settings.

14. The system of claim 12 wherein the declarative or intent-based user input includes a selection, by the user and via a user interface, of the physical or non-emulated testbed element to be added to the updated test infrastructure from among the one or more predetermined device profiles accessible by the network test system.

15. The system of claim 12 wherein the declarative or intent-based user input includes user preferences and indicates that the updated test infrastructure should be changed and the network test system or a related entity uses the declarative or intent-based user input to automatically select the physical or non-emulated testbed element to be added to the updated test infrastructure.

16. The system of claim 15 wherein the user preferences indicate that infrastructure elements are selected using a best fit selection technique, a least cost selection technique, a multiple factor selection technique, or a user-defined selection technique.

17. The system of claim 10 wherein the configuration instructions are based on configuration settings, capabilities, or metadata indicated by a device profile associated with the physical or non-emulated testbed element.

18. The system of claim 10 wherein the configuration instructions include testbed device bill of materials (BOM) information, topology information, device configuration parameter settings, guided setup instructions, orchestration commands, configuration commands, setup related multimedia, configuration source files, or inter-device cabling information.

19. The system of claim 10 wherein the physical or non-emulated testbed element includes a network node, a network switch, a network router, a whitebox switch, or a programmable switch.

20. A non-transitory computer readable medium having stored thereon executable instructions embodied in the non-transitory computer readable medium that when executed by at least one processor of a computing device cause the computing device to perform steps comprising:
  at a testbed transpiler of a network test system implemented using at least one processor:
    receiving test configuration information associated with a test session for configuring a test infrastructure connecting at least one test application and a system under test (SUT), wherein the test infrastructure includes a switching fabric emulator comprising at least one switching application-specific integrated circuit (ASIC) or programmable switching chip, wherein the test configuration information includes information for configuring the switching fabric emulator to emulate one or more emulated switches by allocating resources of the at least one switching ASIC or programmable switching chip to the one or more emulated switches;

generating, using input regarding an updated test infrastructure and the test configuration information, updated test configuration information for configuring the updated test infrastructure, wherein the updated test infrastructure includes a physical or non-emulated testbed element, wherein generating the updated test configuration information includes transpiling or translating a portion of the test configuration information to generate configuration instructions for configuring the physical or non-emulated testbed element; and providing the updated test configuration information to the updated test infrastructure or a related test configuration manager.

* * * * *